United States Patent [19]
Gitlin et al.

[11] Patent Number: 5,191,462
[45] Date of Patent: Mar. 2, 1993

[54] FIBER OPTIC TRANSMISSION DISTORTION COMPENSATION

[75] Inventors: Richard D. Gitlin, Little Silver; Sanjay Kasturia, Red Bank; Robert G. Swartz, Tinton Falls; Jack H. Winters, Middletown, all of N.J.

[73] Assignee: AT&T Bell Laboratories, Murray Hill, N.J.

[21] Appl. No.: 534,623

[22] Filed: May 11, 1990

[51] Int. Cl.[5] .............................................. H04B 10/06
[52] U.S. Cl. .................................... 359/189; 359/194
[58] Field of Search ............... 455/612, 619, 613, 600, 455/617; 359/189, 194, 154, 111; 370/32.1; 379/410, 411; 329/319, 349

[56] References Cited

U.S. PATENT DOCUMENTS

| | | | |
|---|---|---|---|
| 3,974,449 | 8/1976 | Falconer | 375/14 |
| 4,181,888 | 1/1980 | Falconer | 375/15 |
| 4,783,137 | 11/1988 | Kosman et al. | 455/612 |
| 4,893,300 | 1/1990 | Carlin et al. | 455/612 |
| 5,023,947 | 6/1991 | Cimini, Jr. et al. | 359/189 |

FOREIGN PATENT DOCUMENTS

0023341 2/1982 Japan ................................. 455/619

OTHER PUBLICATIONS

Dunik, Digital Optical Discrimination, IBM Technical Disclosure Bulletin, vol. 20, No. 6, Nov. 1977.

Primary Examiner—Edward L. Coles, Sr.
Assistant Examiner—Kinfe-Michael Negash
Attorney, Agent, or Firm—Henry T. Brendzel

[57] ABSTRACT

Signal distortion in fiber optic systems is compensated for by forming decisions as to the transmitted information as a joint function of the received signal and of a feedback signal. The latter, in turn, is a function of decisions made for at least one signal transmitted over the fiber. The feedback signal determines the value of a threshold to which the received signal is compared in order to generate the decisions.

13 Claims, 10 Drawing Sheets

FIBER OPTIC TRANSMISSION DISTORTION COMPENSATION

BACKGROUND OF THE INVENTION

The present invention relates to fiber optic transmission and, in particular, to the compensation for distortion created by such impairments as signal dispersion and nonlinearities.

It has long been recognized that the bit rate with which, and/or distance over which, information can be communicated over a fiber optic transmission channel is limited by various impairments introduced by the channel and/or the transmission equipment. These include, for example, polarization dispersion and chromatic dispersion. Specifically, as the bit rate and distance increase, the distortive effects of these impairments on the transmitted information also increase and, at some point, accurate information recovery becomes impossible. One impairment, chromatic dispersion, has a linear delay vs. frequency characteristic, which can easily be compensated for by simple linear equalization techniques when coherent detection (which preserves this linearity) is used. Moreover, one of us has found that the distortive effects of polarization dispersion can also be compensated for using simple equalization techniques if the degree of polarization dispersion is sufficiently small.

However, such equalization techniques may not be adequate. For example, direct, rather than coherent, detection is often preferred because it is less complex to implement. Unfortunately, though, chromatic dispersion gives rise to nonlinear distortion in the electrical signal at the receiver when direct detection is used. Such distortion cannot be compensated for using the aforementioned linear equalization techniques. Moreover, as polarization dispersion becomes larger, linear equalization becomes less practical and/or less effective because an increasingly large number of delay elements are required in the equalizer.

Adding to the foregoing problems are fiber nonlinearities which begin to manifest themselves as the capabilities of the channel are pushed to their limits through the use of increased signal power, higher bit rates, longer transmission distances and multiple channels. Firstly, these nonlinearities, by their very nature, introduce nonlinear distortion into the transmitted signals. Moreover, fiber nonlinearities, in combination with the chromatic and polarization dispersion, can increase the overall distortive effect to a degree which is greater than the sum of the individual effects.

SUMMARY OF THE INVENTION

In accordance with the present invention, it has been recognized that the foregoing problems can be solved by utilizing, in the fiber optic transmission context, a technique which has heretofore been applied in such unrelated fields as voiceband data transmission. In accordance with that technique, decisions as to the transmitted information are formed as a joint function of the received signal and of a feedback signal. The latter, in turn, is a function of decisions made for at least one signal transmitted over the fiber.

In preferred embodiments of the invention, more particularly, the decisions are formed by comparing the received signal to a threshold as, indeed, is done in prior art arrangements of this general type (e.g., voiceband data systems). In such prior art arrangements, however, the feedback signal is used to modify the received signal whereas, in accordance with a feature of the invention, it has been recognized that it is advantageous to use the feedback signal in order to generate the threshold.

Other features of the invention are specifically pointed out hereinbelow.

DETAILED DESCRIPTION

Figure 1:
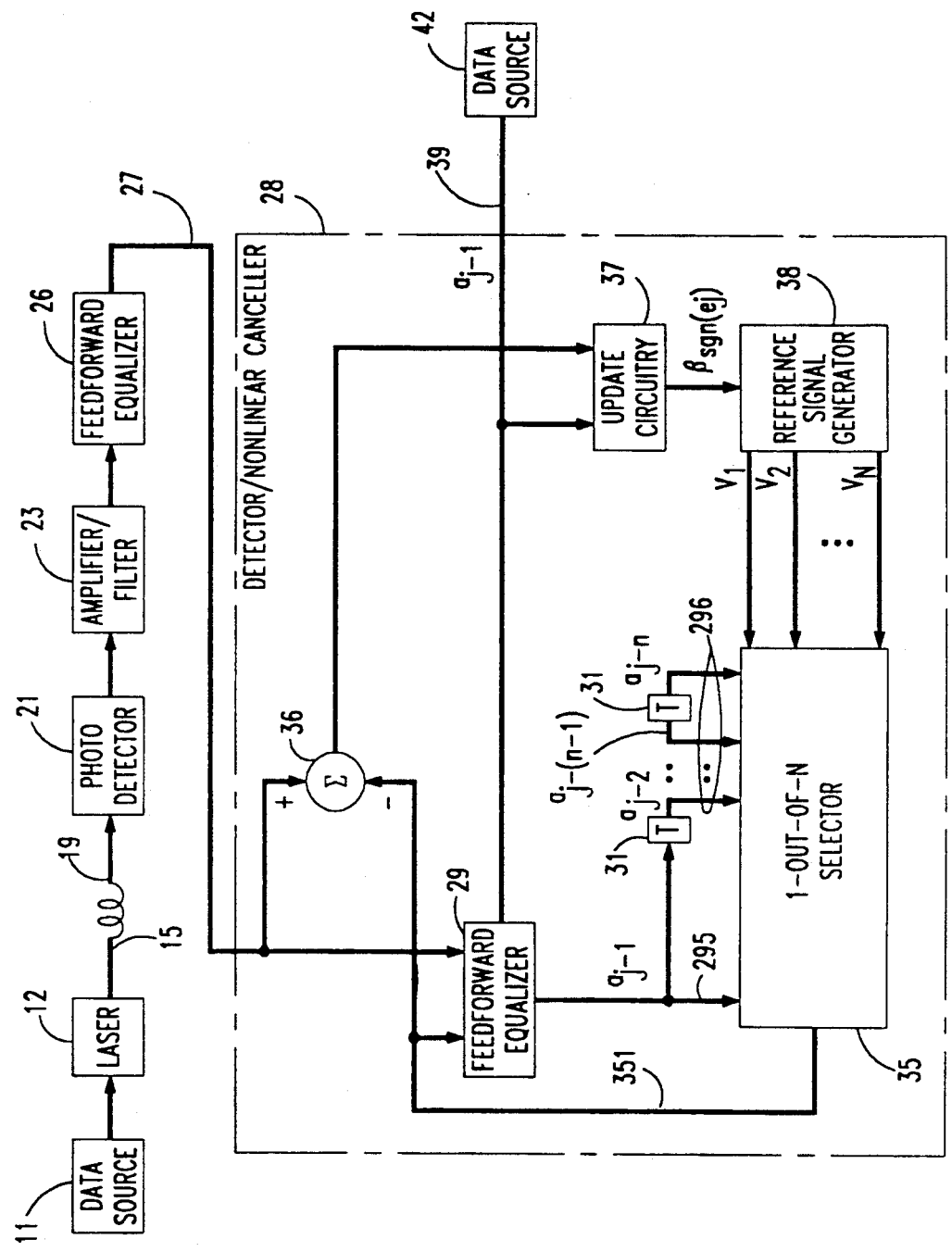
FIG. 1 is a block diagram of a fiber optic transmission system embodying the principles of the invention.

In the system of FIG. 1, a stream of data symbols from a data source 11 modulates a laser 12, which launches an optical signal into an optical fiber 15. In this embodiment, each data symbol is comprised of a single data bit, and the bit rate is illustratively greater than 1 gigabit/second. At the far end of the fiber, the optical signal is received at an input terminal 19 of photo detector 21. The received signal is then converted to electrical form by photo detector 21, serving as a so-called direct detector. The resulting electrical signal is amplified and low-pass filtered by amplifier/filter 23. (Alternatively, the received signal could be mixed with an optical signal local oscillator for coherent detection, in which case the filtering will be low pass if homodyne detection is used and band pass if heterodyne detection is used.)

Thereafter, in standard fashion, feedforward equalizer 26 (which may not be required in some applications) processes the signal to compensate for (principally precursor) linear intersymbol interference. The resulting signal is thereafter applied to detector/nonlinear canceller 28 which outputs, on lead 39, decisions as to the bits that were generated by data source 11. That sequence is applied to data sink 42, with the decision made for the $j^{th}$ signalling interval being denoted $a_j$.

In accordance with the invention, detector/nonlinear canceller 28 includes circuitry which uses at least one prior decision to generate, as described in detail hereinbelow, a feedback signal on lead 351 within detector/nonlinear canceller 28 that is used to provide further compensation for distortion——both linear and nonlinear——in the received signal. Before proceeding with a further description of this circuitry, however, it will be helpful to describe the theory of its operation with reference to FIG. 2.

Figure 2:
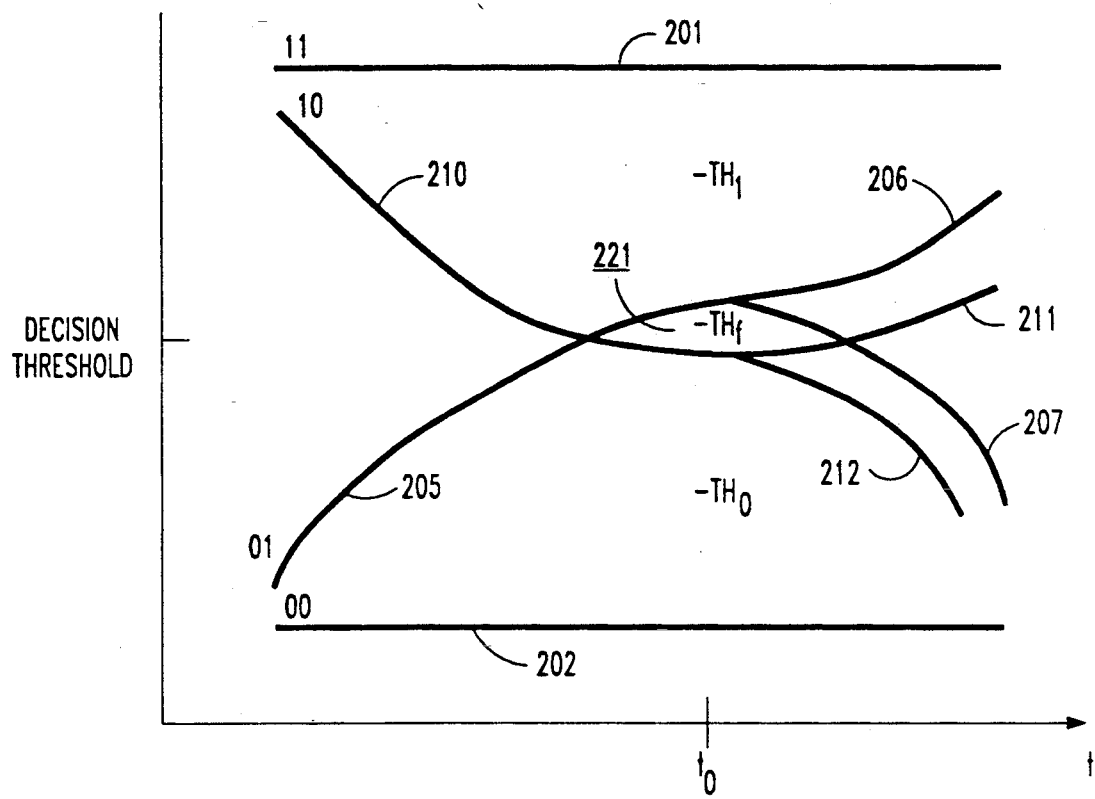
FIG. 2 are waveforms helpful in understanding the principles of the invention.

In particular, FIG. 2 shows typical signal waveforms that may appear on lead 27 at the output of equalizer 26. As noted above, the transmitted symbols are individual data bits, i.e., the signal is binary, although a multi-level signalling scheme is also possible. In particular, it is assumed that a binary "1" in the transmitted bit stream appears as a "high" signal value on lead 27 whereas a binary "0" appears as a "low" singal value. The distortion in the channel is such, however, that the value of the signal associated with that particular signalling interval, but also one or more time-adjacent bits. In particular, it is assumed in this simplified example that a pair of "1"s ("0"s) will, in fact, produce the maximum (minimum) signal value, as denoted by 201 (202) in FIG. 2. On the other hand, a "01" or "10" bit pair will produce signal waveforms which are between those two waveforms, as denoted by 205 and 210, respectively. The two branches of waveform 205——denoted 206 and 207——occur as a function of whether the value of the bit following the bit pair is either "1" or "0", respectively, and similarly for the two branches 211 and 212 of waveform 210. The time overlap of all such waveforms is referred to as the signal "eye" and the area between waveforms 205 and 210, indicated at 221, is referred to as the "eye opening".

It is assumed that the second bit of the bit pair is the transmitted bit to be detected during the current signalling interval, which is centered in time about $t_0$. This bit detection is accomplished by observing the signal on lead 27 at time $t_0$ and comparing it to a threshold. In accordance with prior art techniques, a fixed threshold $TH_f$ is usually established at a level halfway between the maximum and minimum received signal levels, i.e., halfway between the levels of waveforms 201 and 202. Alternatively, if the distortion generates an eye opening which is not centered about that halfway level, the threshold could be set to be in the middle of that eye opening, wherever it happens to fall, as long as the distortion introduced by the channel does not vary with time.

One way of achieving the aforementioned further distortion compensation would be to use the fixed threshold $TH_f$ and attempt to increase the size of the eye opening——thereby creating the maximum distance between the signals which represent "1"s and the signals which represent "0"s, such as waveforms 205 and 210——by using the aforementioned decision-derived feedback signal on lead 351 to modify the signal on lead 27 so that more reliable decisions can be made. The net effect of this approach is to shift waveforms 202 and 205 (201 and 210) up (down) such that threshold $TH_f$, instead of being so much closer to waveform 205 (210) at time $t_0$ than it is to waveform 202 (201), is halfway between them. Indeed, this approach is practical at relatively low data rates. However, the feedback signal on lead 351 varies at the bit rate, as will be seen. As a result, combining it with the signal on lead 27 can, at high bit rates, create several problems, such as reflections and feedthrough, which can severely compromise the performance of the distortion compensation technique.

In accordance with a feature of the invention, however, it has been recognized that these problems can be overcome by not modifying the signal on lead 27 but, rather, by using the feedback signal on lead 351 to provide a varying threshold. Thus looking again at FIG. 2, and assuming that the prior decision was a "0" (and was correct), then the waveform on lead 27 should be either waveform 205 or 202, depending on whether the bit to be detected is either a "1" or a "0". This being so, the feedback signal on lead 351 can be generated so as to set the threshold at time $t_0$ halfway between the expected values of those two waveforms——at $TH_0$——and thereby achieve decisions that are just as reliable as the first-mentioned approach. Similarly, the threshold can be set at $TH_1$ if the prior decision was a "1". Additionally, using additional prior decisions to determine the value of the feedback signal can provide a more precisely positioned threshold and, thus, more accurate data recovery.

Note that with this approach, we are not removing distortion from the signal. That is, the eye opening has not been increased. Rather, we are using information about that distortion to set the threshold in such a way as to achieve an equivalent effect.

Returning now to FIG. 1, detector/nonlinear canceller 28 is seen to include threshold detector 29, T-second delay elements 31 (where T is the signalling interval duration), and 1-out-of-N selector 35. The feedback signal on lead 351 is, in fact, the aforementioned varying threshold. Threshold detector 29 compares the signal on lead 27 with the threshold on lead 351 and, depending on which is larger for any given signalling interval, outputs to data sink 42 on lead 39, as mentioned above, a decision $a_{j-1}$ having either the value "1" or the value "0".

At the same time, one or more decisions that have already been made to this point are used to generate the feedback signal on lead 351 for purposes of generating the next decision $a_j$. Those decisions are hereinafter referred to as the "input prior decisions" and comprise the decisions $a_{j-1} \ldots a_{j-(n-1)}, a_{j-n}$ (where n is some integer). In theory, the circuitry which generates the feedback signal on lead 351 could be implemented using a random access memory or other lookup table which uses the input prior decisions as an address to a random access memory location in which is stored a representation of the appropriate feedback signal level which could then be converted to an analog signal for use by threshold detector 29. However, presently known circuitry of this type is not capable of opearating at sufficiently high data rates for this type of application. Various other approaches which can be used instead for generating the feedback signal on lead 351 are, however, shown herein and are discussed hereinbelow.

With specific reference first to FIG. 1, the input prior decisions $a_{j-2} \ldots a_{j-(n-1)}, a_{j-n}$ are applied to selector 35 on leads 296——which extend from T-second delay elements 31——and input prior decision $a_{j-1}$ is supplied on a lead 295, extending from within threshold detector 29, as described hereinbelow. In this way, a number of prior decisions are applied to selector 35 concurrently. Selector 35, in turn, generates the feedback signal on lead 351 as a function of the decisions input thereto. In particular, each different combination of input prior decisions causes the feedback signal to take on a respective value for the signalling interval in question. Specifically, selector 35 selects one of N signal levels $V_1, V_2, \ldots, V_N$, supplied by reference signal generator 38, as a function of the values of the input prior decisions, the parameter N being equal to $2^n$, where n is the total number of leads 295-6. The values of $V_1, V_2, \ldots, V_N$ are determined in a manner hereinafter described.

Advantageously, the circuitry just described compensates for both linear and nonlinear distortion in the received signal, as noted above. Specifically, distortion which is caused by interference from one signalling interval into another signalling interval can be compensated for by inputting a single prior decision to selector 35. Distortion from multiple signalling intervals into a particular other signalling interval can be compensated for by inputting a plurality of prior decisions to selector 35——which is the general case depicted in FIG. 1. In general, the number of prior decisions that are input to the selector in a particular embodiment is chosen based on the severity and nature of the expected distortion, perhaps balanced by cost or other considerations.

The various levels that can be assumed by the feedback signal on lead 351 may be predetermined based upon expected fixed dispersion in the channel. However, most dispersion changes with time. Hence, it is desirable to adaptively change those levels as the characteristics of the channel change in such a way as to optimally compensate for the dispersion at all times. Such an approach also eliminates the requirement of having to precisely know the dispersion, a priori, even if it does not vary with time.

Moreover, in accordance with a further feature of the invention, the output of the selector can be either a linear or nonlinear function of the input prior decisions. In particular, if it is a nonlinear function of the input prior decisions, the circuitry can, advantageously, compensate for nonlinear distortion caused by interference from multiple signalling intervals.

Indeed, the present illustrative embodiment utilizes an algorithm for adapting the values $V_1, V_2, \ldots, V_N$ as a nonlinear function of the input prior decisions. In particular, the value of the one of the values $V_1, V_2, \ldots, V_N$ that is used during the current signalling interval is thereafter updated by an updating increment equal to $\beta \text{sgn}(e_j)$ where $\beta$ is a small fixed step size that is determined based on the expected rate of change of the distortion in the channel and/or the adaptation time, sgn( ) is the signum function, and $e_j$ is an error signal associated with the $j^{th}$ signalling interval and which is a function of the difference between the signals on leads 27 and 351 as formed by subtracter 36. Specifically in this embodiment, $e_j$ is given by that difference a) plus half the difference between the desired level on lead 27 for a signal representing a "1" and that representing a "0", if the decision bit for the $j^{th}$ signalling interval is a "1", and b) minus that amount if the decision bit for the $j^{th}$ signalling interval is a "0". A signal representing the quantity $\beta \text{sgn}(e_j)$ is generated by update circuitry 37 and is applied to reference signal generator 38.

Note that for the $j^{th}$ signalling interval, only one threshold level is adjusted, viz., the level that is output when the ensemble of input prior decisions have the values that they in fact have during that interval. (Of course, the adjusted level is used only some time after the $j^{th}$ signalling interval——specifically, when the input prior decisions again have that same set of values.) To this end, although not shown in the drawing, reference signal generator 38 also receives the signal on leads 295-6 so as to identify the threshold level that is to be updated.

A further problem to be dealt with is that of being able to provide the feedback signal on lead 351 at the required time at gigabit/second rates. This problem is particularly acute when, as is generally the most useful case, the decision made for the $j^{th}$ signalling interval is to be used to provide the threshold for the next, $(j+1)^{st}$ signalling interval. With specific reference to FIG. 1, a problem arises because the bit decision on lead 39 is guaranteed to appear and be stable only by the end of the signalling interval. At that time, however, the threshold value used to determine $a_{j+1}$ needs to be present on lead 351 because threshold detector 29 starts to compare the signal levels on leads 27 and 351 at that time. Accordingly, the appropriate threshold level must already be present on the latter lead. Because of the (albeit relatively small) delay introduced by selector 35 as well as signal propagation delays along the circuit signal paths, this feedback signal will not be available in time if the decision bit on lead 39 is used to provide the value of the immediately preceding decision to selector 35.

Figure 3:
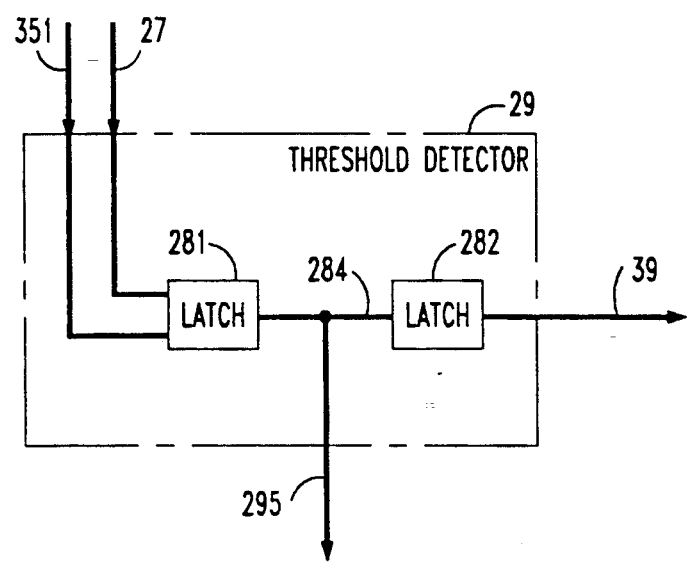
FIG. 3 is a block diagram of a threshold detector used in the system of FIG. 1.

In accordance with a feature of the invention, this problem is overcome by recognizing that, as shown in FIG. 3, the standard threshold detector is actually implemented using two latches, shown as latch 281 and latch 282. During the first half of a given signalling interval, latch 281 is in its so-called acquire mode during which it provides on its output lead 284 a signal—actually a differential signal—proportional to the difference between its two input signals. Latch 281 is thus operating as a comparator. Latch 282 is in its so-called "hold" mode at this time and ignores the signal on lead 284. During the second half of the signalling interval, latch 281 switches to its hold mode in which it outputs a constant logic level indicative of the polarity of the signal on lead 284. At this same time, latch 282 switches from its hold mode—in which it has been holding a signal indicative of the polarity of the signal on lead 284 that obtained during the previous signalling interval—to its acquire mode. Thereafter, during the first half of the next signalling interval, latch 282—again in its hold mode—provides on lead 39 a constant logic level representing the signal acquired from lead 284 during the second half of the prior signalling interval.

Figure 11:
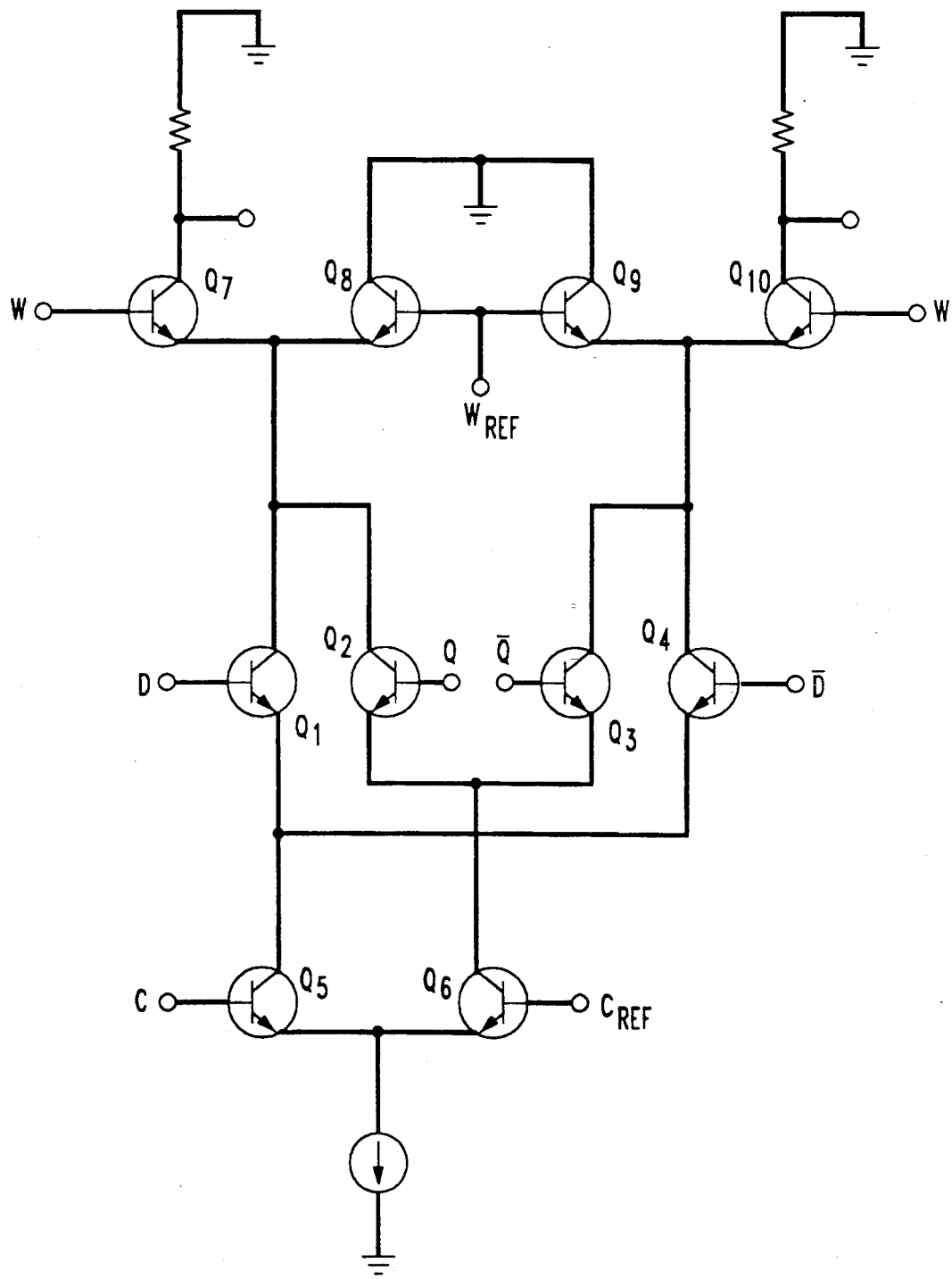
FIG. 11 is a circuit diagram of a multiplying latch illustratively used in the detector/nonlinear canceller depicted in FIG. 10.

Thus it is seen, as noted above, that this output on lead 39 is guaranteed to appear and to be stable only by the end of the second half of the signalling interval—which is too late. What has now been recognized, however, is that there is available on lead 284 a signal indicative of the value of $a_j$ that will appear only some time later on lead 39 and that the former signal can be advantageously used in place of the latter. Specifically, the selector 35 has an additional half a signalling interval in which to generate the feedback signal. For the single prior decision case, this feedback signal can also be generated using a multiplying latch as shown in FIG. 11 and described hereinbelow.

The above approach has the disadvantage in that the feedback signal 351 is an analog signal, and it is difficult to maintain accuracy of an analog process when operating at high frequencies. Thus as the number of input prior decisions increases and, concomitantly, the gradations between the various possible threshold levels become smaller, the accuracy of the overall process can suffer.

Figure 4:
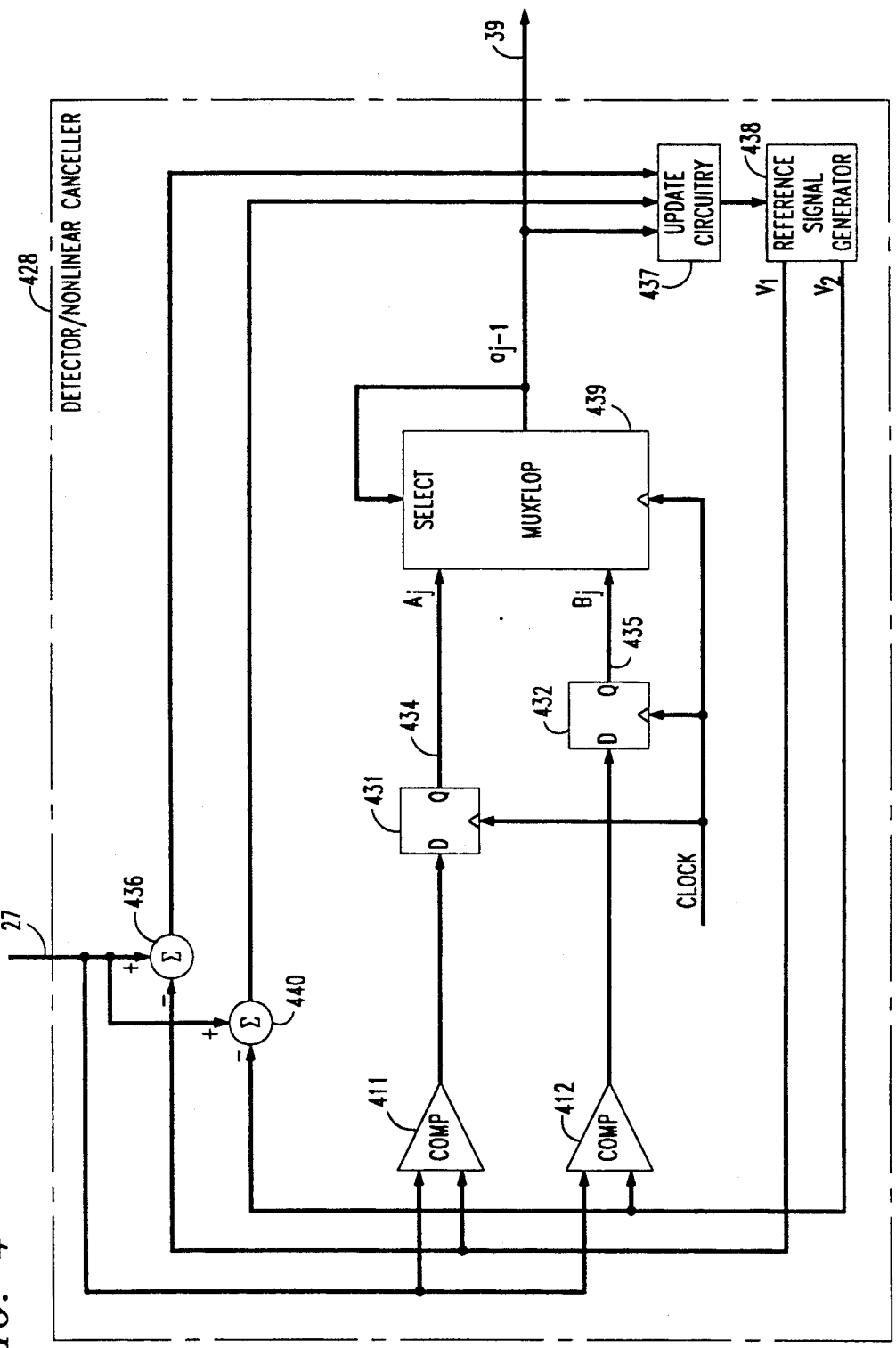
FIGS. 4-9 show various alternative embodiments of the detector/nonlinear canceller used in the system of FIG. 1.

FIG. 4 shows an alternative embodiment of a detector/nonlinear canceller—bearing the reference numeral 428—for use in the system of FIG. 1 where the only feedback signals that must change at the data rate are digital signals, thereby easing implementation problems.

As before, detector/nonlinear canceller 428 includes a reference signal generator, denoted 438. Since only one input prior decision is used, reference signal generator 438 provides only two signal levels, $V_1$ and $V_2$. The particular one of these two signal levels that the input signal is to be compared with for purposes of generating an output decision is not selected in the first instance, as in the case of the FIG. 1 embodiment. Rather, in accordance with a feature of the invention, the input signal is compared with each of the signal levels $V_1$ and $V_2$ by respective comparators 411 and 412. The results of each of these comparisons are clocked as either "0"s or "1"s into respective flip-flops 431 and 432 during the first half, or phase, of a clock cycle and the output of flip-flops 431 and 432, denoted $A_j$ and $B_j$, are presented to respective inputs of a multiplexing flip-flop, or "muxflop" 439. Thus the signal $A_j$ on lead 434 represents the decision value that would obtain if $V_1$ were to be the proper threshold and the signal $B_j$ on lead 435 represents the decision value that would obtain if $V_2$ were to be the proper threshold. Thus, these two signals may be thought of as "tentative" decisions. At this time, muxflop 439 is holding, and providing at its output on lead 39, the immediate prior decision, $a_{j-1}$. The value of this decision ("0") or ("1") is, of course, the determinant as to which of the two values $V_1$ and $V_2$ should be used as the threshold for making a decision as to the bit value currently represented by the input signal on lead 27. Accordingly, during the second phase of the clock cycle, muxflop 439 takes in the appropriate tentative decision, as indicated by the value of $a_{j-1}$ supplied as a feedback signal to its own "select" input from lead 39. At the same time, $a_{j-1}$ controls, within update circuitry 437, which of the outputs from subtractors 436 and 440 is to be used in performing the updating. The latter, operating like update circuitry 37 of FIG. 1, supplies update information to the reference signal generator.

Central to the workability of detector/nonlinear canceller 428 is the availability of a muxflop which can, in fact, latch in a selected value during one clock cycle phase and, during the second phase, supply that value back around to its own select input—all at gigabit/second rates. Advantageously, such devices are commercially available where, as in this embodiment, only one input prior decision is being used. Consider, however, the extension of the approach taken in FIG. 4 to the more general case, i.e., where more than one input prior decision is employed to determine the next threshold value to be used. For example, if two input prior decisions were employed, then the detector/nonlinear canceller would include four comparators feeding, ultimately, a 1-out-of-4-input muxflop having a two-bit select input to receive the two most recent prior decisions. Given the current state of the technology, however, the multiplexer and flip-flop functions provided by muxflop 439 would have to be carried out by separate/distinct multiplexer and flip-flop circuitries.

Figure 5:
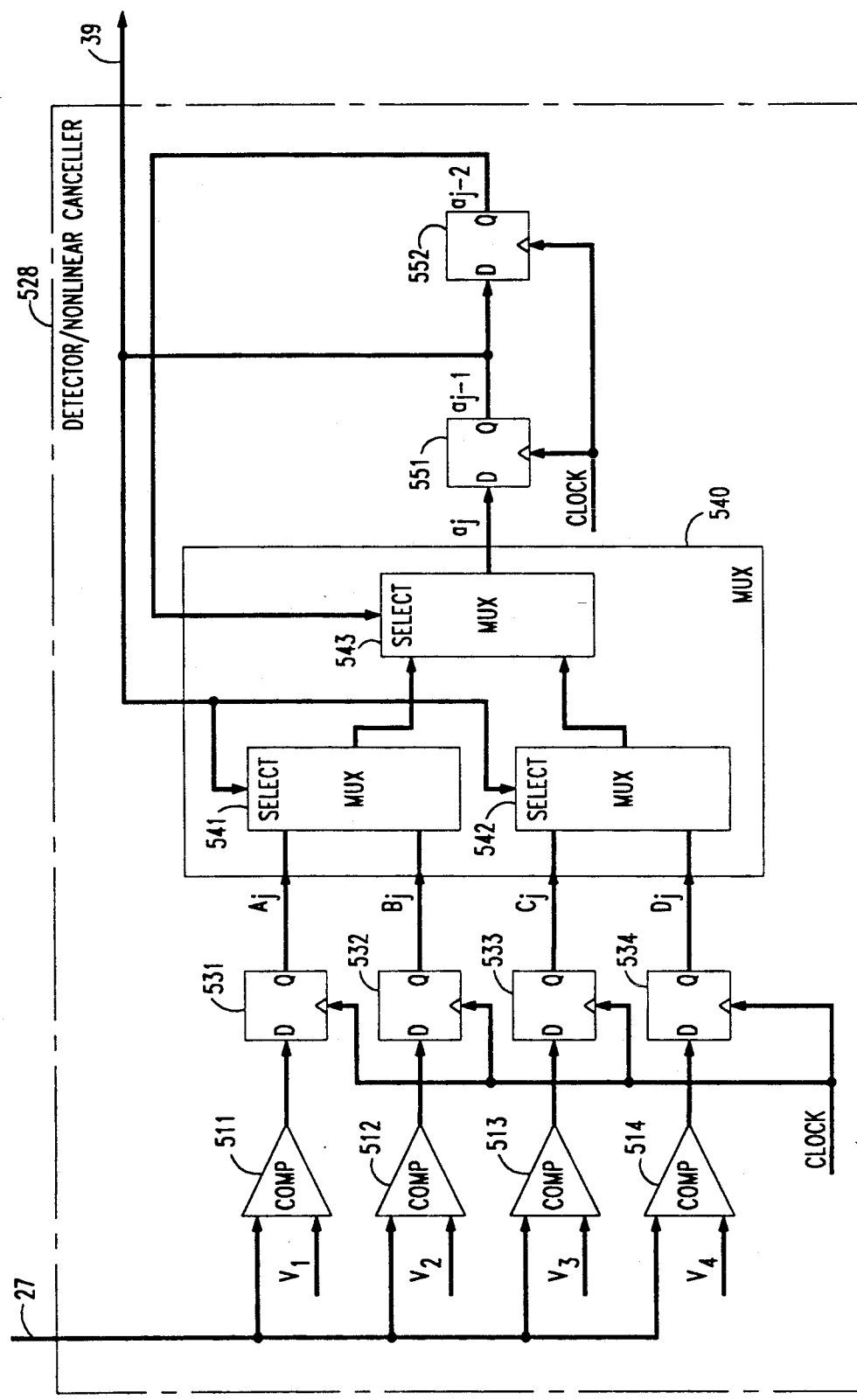

This may be more fully understood by considering an arrangement of the type just described, shown in FIG. 5 as detector/nonlinear canceller 528. (In FIG. 5—as well as FIGS. 7-9 discussed hereinbelow—the circuitry which generates and updates the reference levels $V_1$ through $V_N$ has been omitted for drawing clarity. It would, however, be the same as is shown in FIG. 4.) Note that there are now four comparators 511 through 514 which receive the four reference levels $V_1, \ldots, V_4$. These feed the four flip-flops 531 through 534 which, in turn, provide the four tentative decisions $A_j$ through $D_j$ to multiplexer 540 whose output $a_j$ feeds through the two flip-flops 551 and 552 whose outputs are, respectively, $a_{j-1}$ and $a_{j-2}$. The latter two outputs serve as selector inputs to multiplexer 540.

Disadvantageously, the practical implementation of 4-to-1 multiplexer 540 is as a combination of three 2-to-1 multiplexers 541, 542 and 543, as shown in the FIG. Such a structure engenders sufficient additional delays over the 2-to-1 multiplexing muxflop that the bit rate that can be accommodated by the system as a whole is limited. Specifically, it may not be possible for multiplexer 540 to respond to $a_{j-1}$ and $a_{j-2}$ fast enough to generate $a_j$ in time to be clocked into flip-flop 551. This can also occur in the design of FIG. 4.

This problem is overcome in accordance with a further feature of the invention. At the heart of this feature is the recognition that by following the steps of a) expressing $a_j$ as a Boolean function of $A_j$ through $D_j$, $a_{j-1}$ and $a_{j-2}$, b) expressing $a_{j-1}$ by simply substituting the quantity $(j-1)$ for the quantity $j$ wherever it appears in the expression derived in a), and c) substituting the expression derived in b) into the expression derived in a), then on can obtain an expression for $a_j$ in terms of $a_{j-2}$ and $a_{j-3}$, i.e., an expression in which there is no dependence of $a_j$ on $a_{j-1}$. Alternatively stated, the expression for $a_j$ is a) an explicit function of the tentative decisions $A_j$ through $D_j$, and $A_{j-1}, \ldots D_{j-1}$, b) an explicit function of prior decisions $a_{j-2}$ and $a_{j-3}$, and c) only an implicit function of $a_{j-1}$. This, in turn, provides circuit design flexibility which enables one to circumvent the processing time problem discussed in connection with FIG. 5.

In the example under discussion, in particular, the above steps result in the following Boolean expression for $a_j$:

$$a_j = W_j \bar{a}_{j-3} \bar{a}_{j-2} + X_j \bar{a}_{j-3} a_{j-2} + Y_j a_{j-3} \bar{a}_{j-2} + Z_j a_{j-3} a_{j-2}.$$

where
$$W_j = (A_j \bar{A}_{j-1} + B_j A_{j-1})$$

$$X_j = (C_j \bar{B}_{j-1} + D_j B_{j-1})$$

$$Y_j = (A_j \bar{C}_{j-1} + B_j C_{j-1})$$

$$Z_j = (C_j \bar{D}_{j-1} + D_j D_{j-1})$$

Moreover, this procedure can be repeated p times so that the Boolean expression for $a_{j-1}$ has no explicit dependence on any decision subsequent to $a_{j-(p+1)}$.

Figure 6:
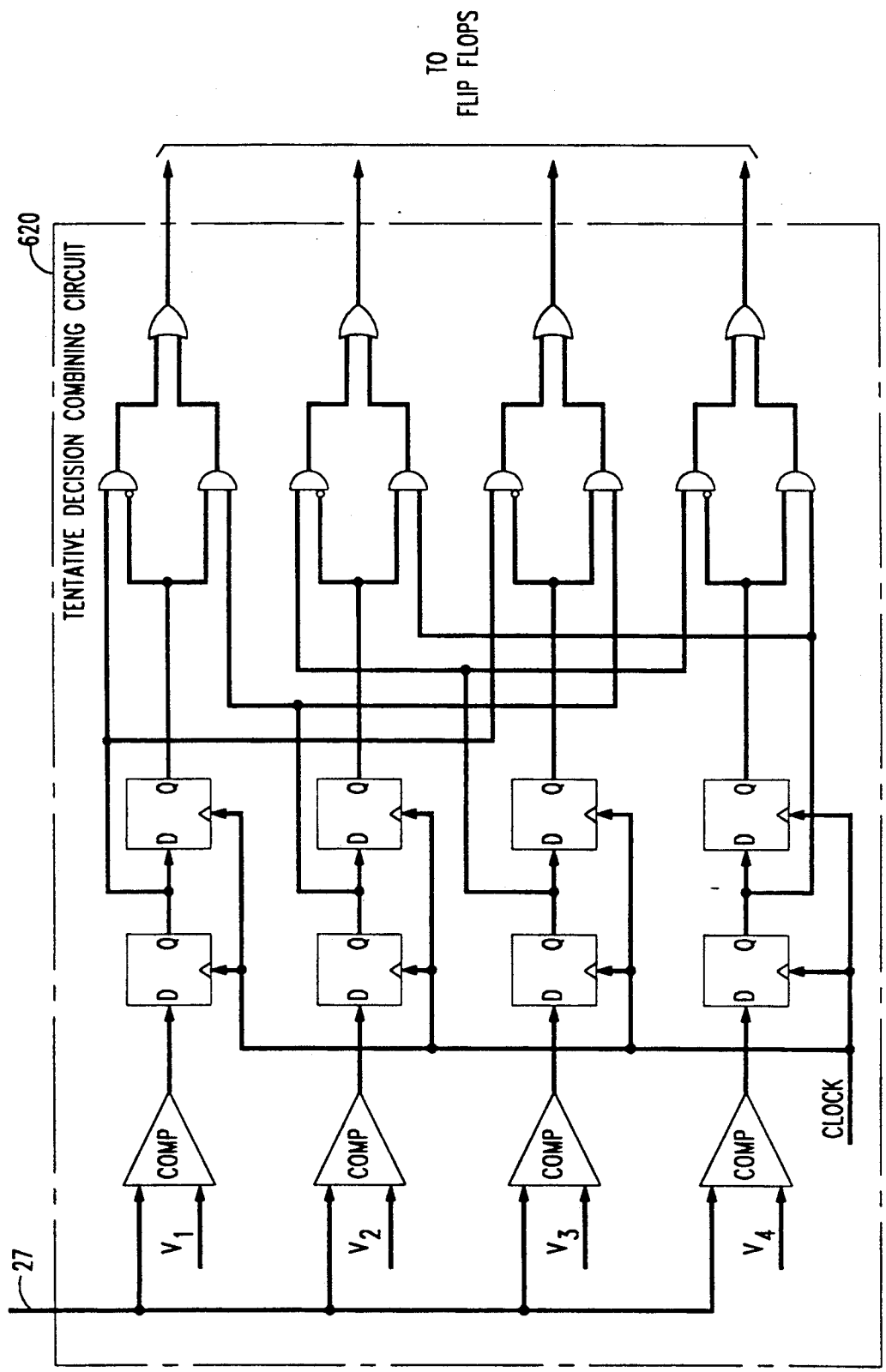
Figure 7:
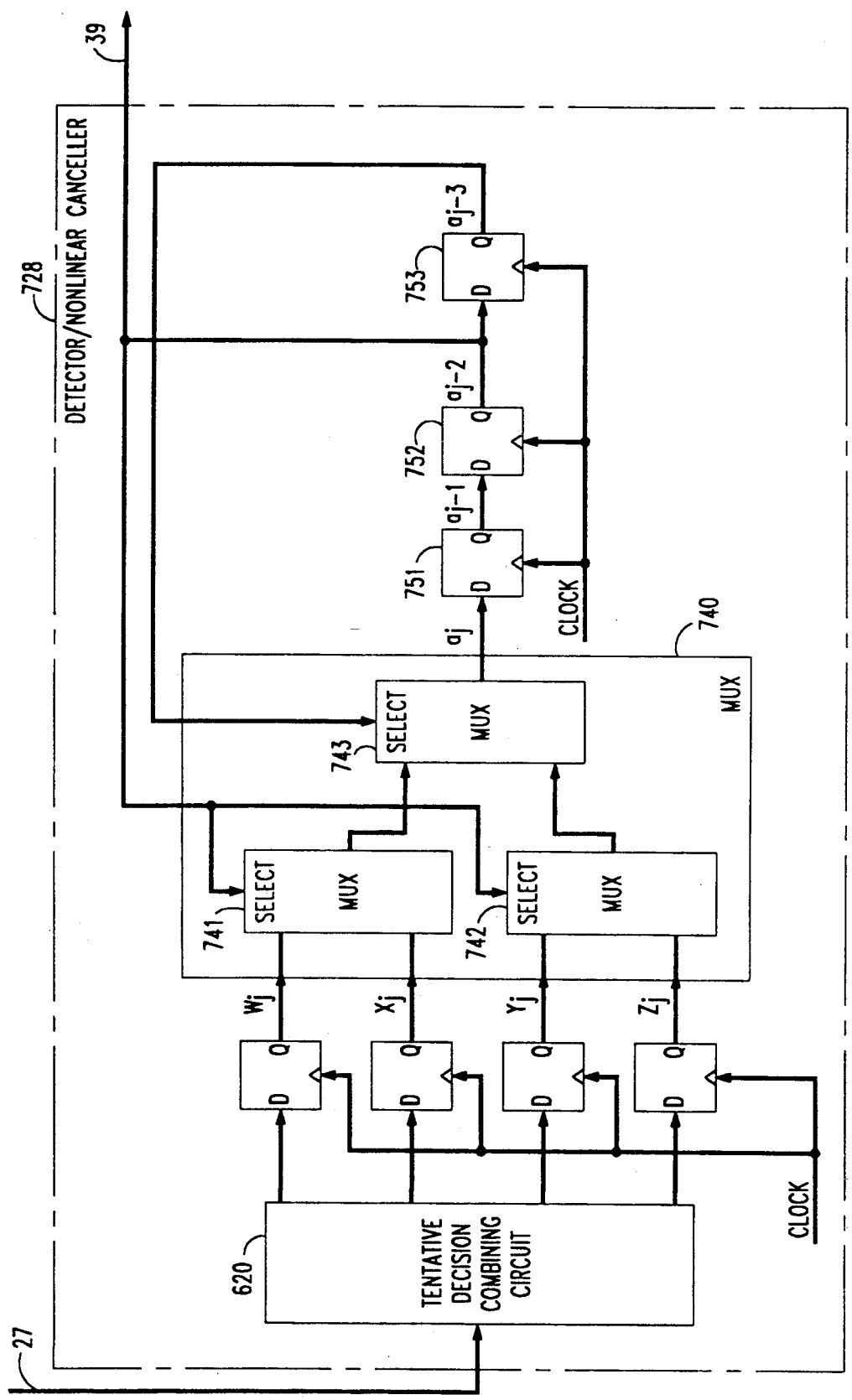

Circuitry which generates $a_j$ in accordance with this expression is shown in FIGS. 6-7. Specifically, the component labelled "tentative decision combining circuit 620" in FIG. 7 provides the above-defined values of $W_j$ through $Z_j$. Illustrative circuitry for implementing the tentative decision combining circuit is shown in FIG. 6. Note that, at this point, the problem has not been solved because multiplexer 740 as shown in FIG. 7 is the same as shown in FIG. 5 and the same processing time problem obtains.

Figure 8:
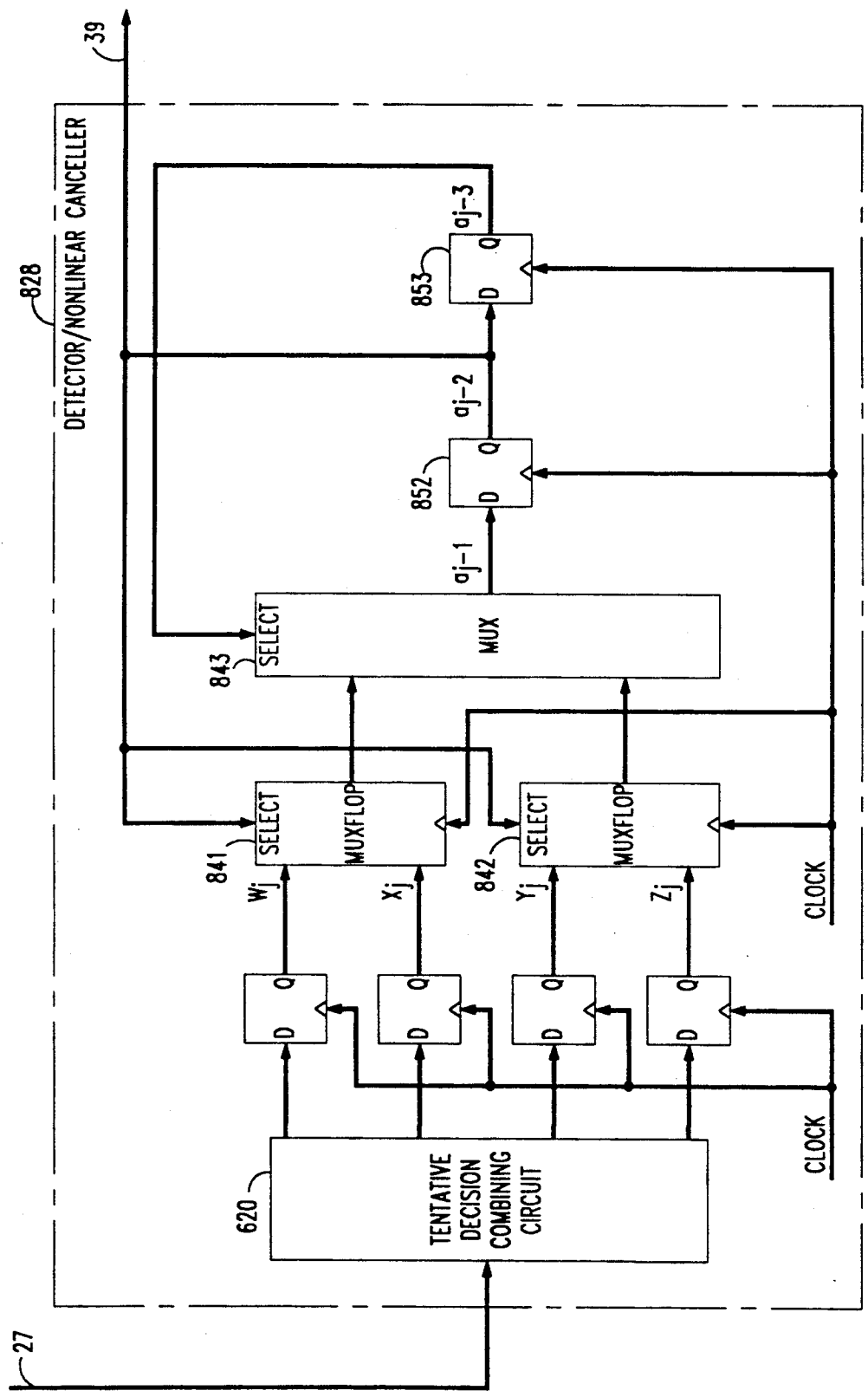
Figure 9:
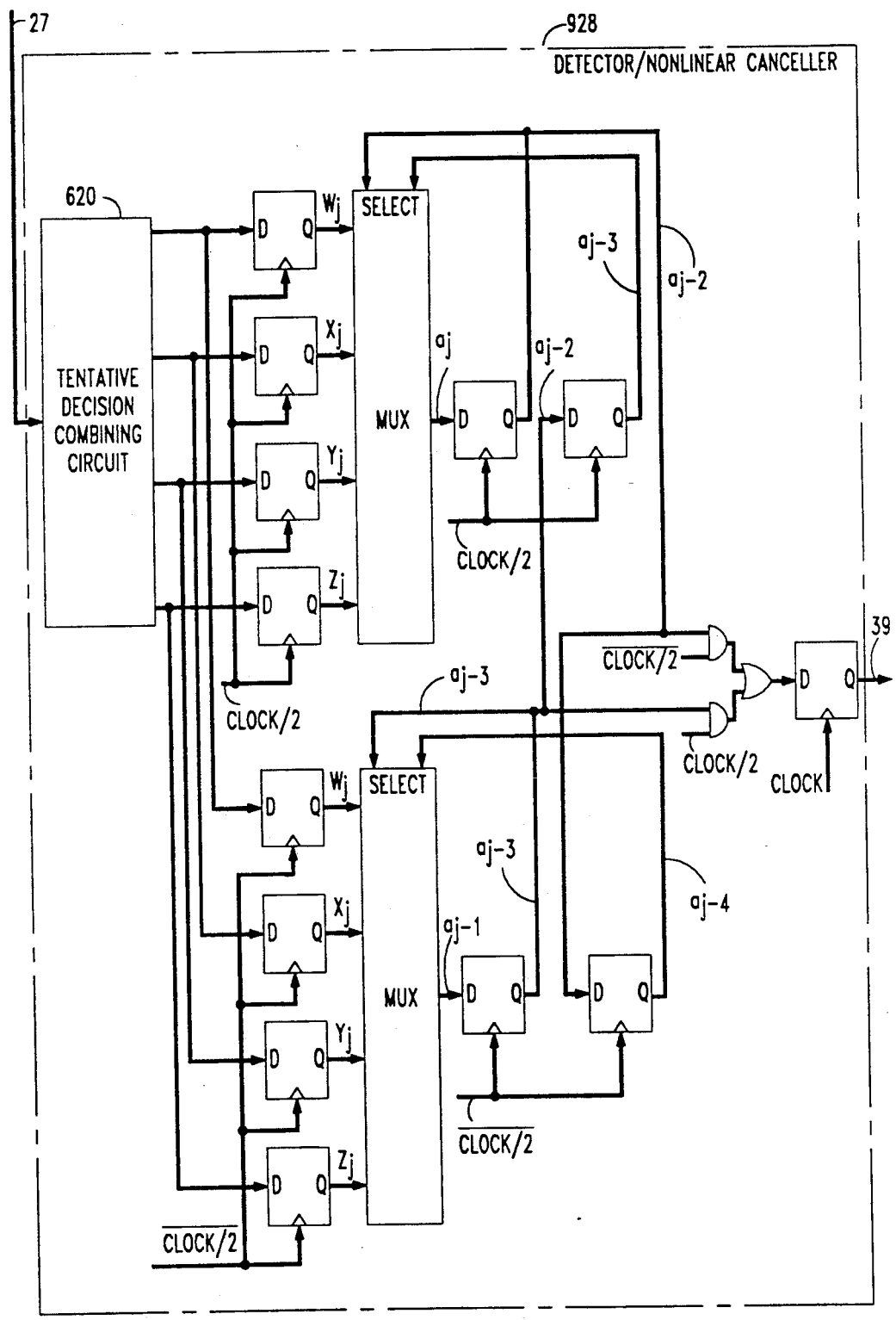

We note, however, that since the output of flip-flop 751 is not fed back to the multiplexer, its presence in the circuit provides nothing more or less than one clock cycle delay. This being so, that delay can be incorporated into 2-to-1 multiplexers 741 and 742. That is, as shown in FIG. 8, the flip-flop of FIG. 7 that provides $a_{j-1}$, i.e., flip-flop 751, can be eliminated, and multiplexers 741 and 742 can be replaced with muxflops 841 and 842, which are identical to muxflop 439 of FIG. 4. As described earlier, such muxflops—unlike a 4-to-1 mux-/flip-flop combination—are indeed capable of operating at the processing speeds of interest to provide an output in time to be fed back. The only "cost" associated with this approach is a one-clock-cycle increase in the overall delay introduced into the detection/cancellation process as a whole. Such a delay is of no practical consequence, however.

As the speed of operation increases yet further, even the muxflops may not be able to operate fast enough. In that case, the approach shown in FIG. 9 may be used. As before, the tentative decision combining circuitry of FIG. 6 feeds the flip-flops. Now, however, the outputs of tentative decision combining circuit 620 are fed in parallel to two sets of circuitries, which are clocked at half the rate at which the quantities $W_j$ through $Z_j$ are generated. One of the two sets of circuitries generates $a_j$ for even values of j and the other for the odd values of j. Since the multiplexers are operated at half the rate they would otherwise have to, the above-described problem associated with processing delays in the multiplexers is, again, overcome.

The various approaches described hereinabove can be extended, in theory, to accommodate any desired number of input prior decisions (including one). Note also that the circuitry of FIGS. 4-9 can also use clocks with different phase timings on each of the comparators. Thus, not only can the threshold depend on the previous bits, but the sample time $t_0$ as well, allowing for even better distortion compensation. However, the amount of circuitry needed to implement these approaches increases exponentially with each increase in the number of input prior decisions, and thus a practical limit is quickly reached.

Figure 10:
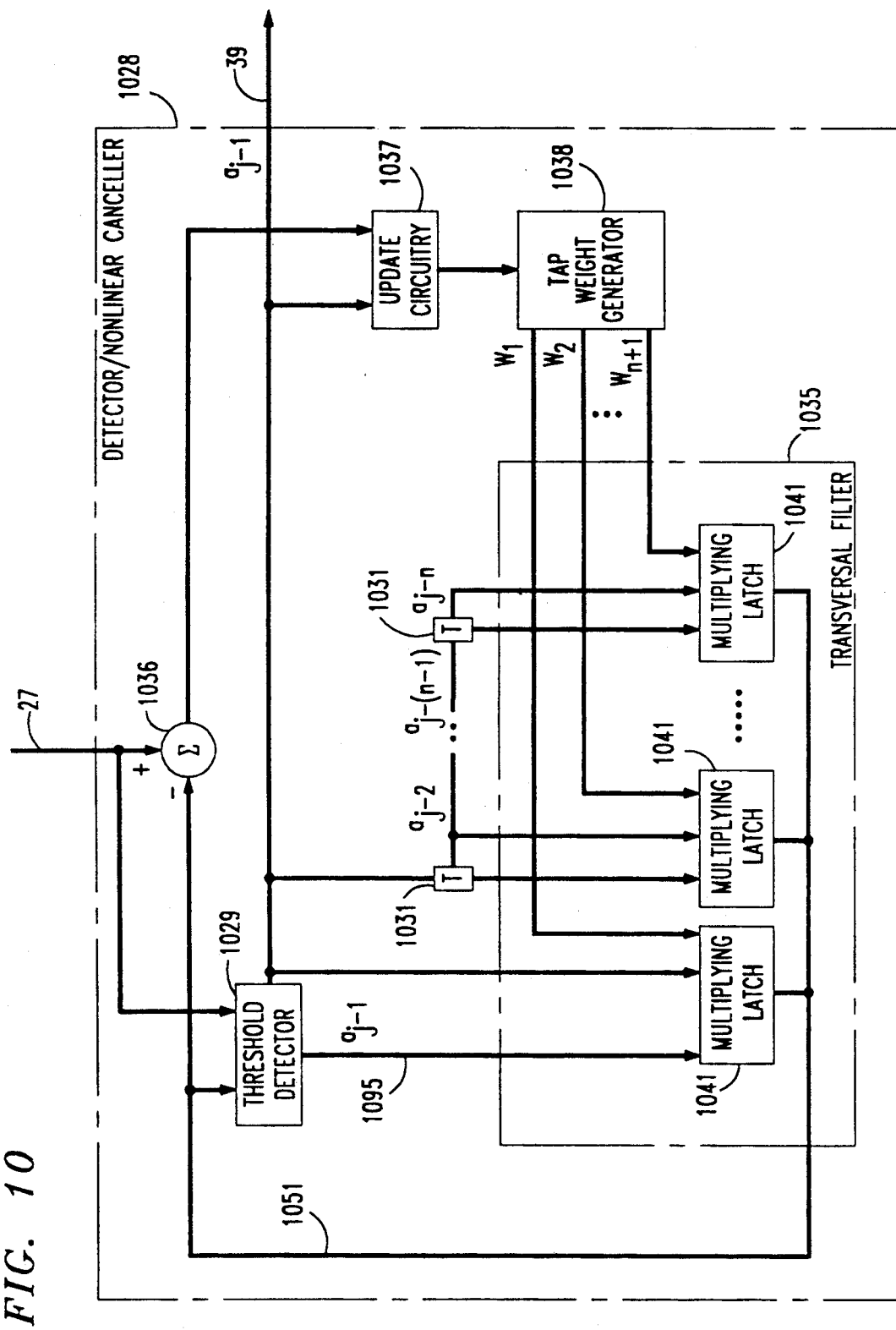
FIG. 10 shows an illustrative embodiment of a detector/linear canceller that can be used in the system of FIG. 1.

Alternatively, in applications where a relatively large number of input prior decisions is desired to be used, the approach shown in FIG. 10 can be employed. This approach has the advantage that only a modest increase in circuitry is required for each increase in the number of input prior decisions. It has the disadvantage, however, in that it operates not via a digital selection process—which is characteristic of the approaches described above—but, rather, in the analog domain, and it is difficult to maintain accuracy of an analog process when operating at high frequencies. Thus as the number of input prior decisions increases and, concomitantly, the gradations between the various possible threshold levels become smaller, the accuracy of the overall process can suffer. Also, this compensates only for linear distortion—not nonlinear distortion. Accordingly, the decision to use this or any of the techniques described herein will thus depend on the particular application and the constraints under which the designer is required to operate.

Turning then to FIG. 10, a similarity to the approach of FIG. 1 will be noticed. In particular, detector/linear canceller 1028 includes a threshold detector 1029 (similar to that shown in FIG. 3), delay elements 1031 and update circuitry 1037. Note, however, that the 1-out-of-N selector is replaced by a transversal filter 1035 and the reference signal generator has been replace by tap weight generator 1038. With this approach, the threshold value supplied to detector 1029 is not one of a plurality of thresholds that are pre-defined. Rather, that threshold value is generated by first multiplying each of the input prior decisions by a so-called tap weight associated with the ordinal position of that decision in the input prior decision stream. Thus, in particular, the most recent input prior decision—provided from within threshold detector 1029 on lead 1095—is multiplied by tap weight $W_1$; the second-most-recent input prior decision—provided at the output of the first one of delays 1031—is multiplied by tap weight $W_2$; and so forth. The resulting products are then summed to provide on lead 1051 a signal whose value—which can be positive or negative—represents an offset, or correction, to a predefined, nominal threshold assumed within threshold detector 1029. The tap weights supplied by tap weight generator 1038 are adaptively updated in just the same way as the reference levels in the FIG. 1 embodiment are updated.

Transversal filter 1035 is illustratively comprised of a plurality of multiplying latches 1041, each of which multiplies a different input prior decision by its associated tap weight to provide an analog signal representative of the product. The outputs of those multiplying latches are then summed on lead 1051, serving as an analog bus, to provide the aforementioned signal offset.

(As will become apparent as this description continues, many of the signals communicated between functional elements shown in FIG. 10 are differential signals which, as is well-known, are carried on pairs of signal leads. For drawing simplicity, however, all such lead pairs are represented in FIG. 10 as single leads.)

FIG. 11 is a circuit diagram of one of multiplying latches 1041, which provides a differential output at the collectors of transistors Q7 and Q10. In particular, the circuit operates in response to a two-phase clock. During the first phase, the clock signal C is higher than the reference level $C_{ref}$. This places the latch in its "aquire" mode in which transistor Q5 is ON, thereby drawing current down through the differential pair Q1, Q4. Specifically, transistor Q1 is ON if the input prior decision—provided as a differential input D,$\overline{D}$—is a "1". (It may be noted here that each of delays 1031 is illustratively a dual-latch device similar to that shown in FIG. 3 and the "D,$\overline{D}$" input is supplied from the output of the first latch, corresponding to the signal on lead 295.)

With transistor Q1 being ON, current is drawn down through the differential pair Q7,Q8. Since no current flows through transistor Q10, its collector is at ground potential, thereby providing one side of the differential output. At the same time, the fraction of the current that flows through transistor Q7, as opposed to transistor Q8, is dependent upon the level of the signal W relative to a fixed level $W_{ref}$ applied to transistor Q8. Signal W is an analog signal representing the appropriate tap weight value, that analog signal being generated from a digital version thereof supplied by tap weight generator 1038. A signal indicative of the product of the input prior decision and its associated tap weight is thus provided as a differential signal between the collectors of transistors Q7 and Q10.

If the input prior decision is a "0", then the roles of differential pairs Q7,Q8 and Q9,Q10 are reversed, and the differential signal has the same magnitude as in the case above but has the opposite sign.

During the second clock phase, transistor Q6 is ON, drawing current through differential pair Q2,Q3. The latter receives as input a differential signal Q,$\overline{Q}$ from the output of the corresponding one of delays 1031 (or, in one case, threshold detector 1029). This causes the differential output signal generated during the first clock phase to be held constant, notwithstanding any changes in the differential input D,$\overline{D}$ during this phase. It is during this phase that the summed products on lead 1051 is read in by threshold detector 1029.

The foregoing merely illustrates the principles of the invention and many variations are possible. For example, the invention is disclosed herein in the context of a system in which information is communicated in a single channel. However, the invention is equally applicable to systems in which the information is communicated in multiple channels, such as channels which are either wavelength-multiplexed or frequency-division-multiplexed. In such systems, the distortion compensation technique could be applied to the signals in each channel independently. However, with such impairments as fiber nonlinearities, the signals in the different channels may interfere with each other. In that case, the vector of decisions used to determine the threshold value used in the circuitry associated with a given channel may include one or more decisions formed by the circuitry associated with one or more other channels. Indeed, in certain situations, such as where crosstalk is the dominant impairment, the decision vector might be comprised exclusively of decisions from one or more other channels, i.e., to the exclusion of decisions from the channel in question.

Further modifications are possible. For example, although the present embodiment assumes a signalling scheme which is binary (bi-level) and one-dimensional, multi-level and/or multi-dimensional signalling could also be used. In addition, although the discussion herein does not make mention of the use of block, trellis or other types of coding schemes, the invention could be used in systems which, in fact, employ such techniques.

In addition, although a particular algorithm was used to update the reference voltages selected by the selector, other algorithms may alternatively be used, such as algorithms which use the analog value of the error signal $e_j$ rather than simply its sign (provided by the signum function, sgn( )).

Additionally, the decisions that are used to determine that feedback signal value may not only be decisions associated with prior signalling intervals, but may also be estimates of the decisions associated with future signalling intervals.

Moreover, since with nonlinearities the distortion can depend upon not only the past and future bits, but also on the bit to be detected, we can combine multiple threshold detector/nonlinear cancellers of the type disclosed herein to determine which of a sequence of one or more bits, or the transmitted bits in multiple channels, was more likely to have been transmitted.

Finally, although the invention is shown herein as being implemented using discrete electronic building blocks, it will be appreciated that the functions of any one or more of these may be able to be implemented via one or more appropriately programmed special- or general-purpose processors, depending on the information rates being used and the state of the technology at the time. Because of the high data rates involved, it is preferable to fabricate at least the threshold detector/-nonlinear canceller on a single integrated circuit chip.

It will thus be appreciated that those skilled in the art will be able to devise numerous arrangements which, although not explicitly shown or described herein, embody the principles of the invention.

We claim:

1. Apparatus comprising
   means for receiving an information-bearing optical signal from an optical fiber to provide a received electrical signal, and
   means for forming decisions as to the information as a joint function of the received electrical signal and of a plurality of threshold signals, said means for forming decisions comprising
      means for generating the plurality of threshold signals,
      means for comparing said received electrical signal with each of the plurality of threshold signals to generate respective tentative decisions, and
      means for selecting a particular one of said tentative decisions to be an individual one of the formed decisions as a function of at least one prior decision.

2. The invention of claim 1 further comprising means for adapavely modifying said plurality of thresholds as a function of said at least one decision.

3. Apparatus comprising
   means for receiving an information-bearing optical signal from an optical fiber to provide an electrical signal, which represents the information, and
   means for forming decisions as to the information as a joint function of the electrical signal and of a feedback signal, said decision forming means comprising
      means for generating a plurality of threshold signals,
      means for generating as the feedback signal a selected one of the plurality of threshold signals,
      and means for comparing the electrical signal with the selected threshold signal,
   wherein said means for comparing includes first and second latches, said first latch generating an intermediate signal representing the results of the comparison during a first clock phase and said second latch generating an output signal in response to said intermediate signal during a second clock phase, said output signal being an individual one of the formed decisions and said selected one of the plurality of thresholds being generated as a function of said intermediate signal.

4. The invention of claim 3 further comprising means for adaptively modifying the plurality of threshold signals as a function of an error signal indicative of the difference between the electrical signal and the threshold signal.

5. Apparatus comprising
   means for receiving an information-bearing optical signal from an optical fiber,
   means for converting the received optical signal into an electrical signal which represents the information, and
   means for forming individual decisions as to the information as a joint function of the electrical signal and of a plurality of prior such decisions, said means for forming individual decisions comprising
      means for comparing said electrical signal with each of a plurality of threshold signals to generate respective tentative decisions, and
      means for forming each said individual decision as a) an explicit function of said tentative decisions, b) an explicit function of at least one of said plurality of prior decisions, and c) an implicit function of at least one other of said plurality of prior decisions.

6. Apparatus for use in a system in which at least one information-bearing optical signal is transmitted over an optical fiber, said apparatus comprising
   means for receiving an electrical signal representing the information carried in said optical signal, and
   means for forming decisions as to the information as a joint function of the electrical signal and of a feedback signal which is a function of at least one prior such decision, said means for forming decisions comprising
      means for generating as the feedback signal a threshold signal which is a function of said at least one decision, and means for comparing the electrical signal with the threshold signal, wherein said means for generating includes a source of a plurality of signals each having a level which corresponds to a respective one of a plurality of levels that can be assumed by the threshold signal, and means for successively gating selected ones of said plurality of signals to the comparing means, the selection being a function of the decisions formed by the decision forming means.

7. The invention of claim 6 further comprising means for adaptively updating the levels of said plurality of signals.

8. The invention of claim 7 wherein the updating means updates the said levels as a function of an error signal indicative of the difference between the electrical signal and the threshold signal.

9. Apparatus for recovering information from an optical signal transmitted over an optical fiber in a succession of signalling intervals, the apparatus comprising amplifier means for receiving an electrical signal representing the information carried in said optical signal, means for forming decisions representing the information transmitted during each one signalling interval as a joint function of a) the received electrical signal and b) a feedback signal, and means for generating said feedback signal as a function of particular decisions applied thereto formed as to the information transmitted during other signalling intervals, wherein the decision forming means further includes a first latch for generating a decision signal indicative of the sign of the difference between the received electrical signal and the feedback signal and a second latch for generating an output decision for said one signalling interval based upon the decision signal, and means for applying the decision signal to the feedback signal generating means as an individual one of said particular decisions.

10. A method for use in a system in which at least one information-bearing optical signal is transmitted over an optical fiber, said method comprising the steps of receiving an electrical signal representing the information carried in said optical signal, forming decisions as to the information as a joint function of the received electrical signal and of a feedback signal which is a function of decisions made for at least one signal transmitted over the fiber, wherein the forming decision step includes the steps of a) providing a plurality of threshold signals,
b) selecting one of the plurality of threshold signals as a function of said at least one decision to provide the feedback signal, and
c) comparing the received electrical signal with the feedback signal.

11. The invention of claim 10 comprising the further step of adaptively updating the values of the plurality of threshold signals.

12. The invention of claim 11 wherein in said updating step the values of the plurality of threshold signals are updated as a function of an error signal indicative of the difference between the received electrical signal and at least one of the plurality of threshold signals.

13. The invention of claim 12 wherein each one of said plurality of threshold signals is a nonlinear function of ones of said decisions.

* * * * *